United States Patent
Toda et al.

(10) Patent No.: US 9,793,218 B2
(45) Date of Patent: Oct. 17, 2017

(54) METHOD FOR MANUFACTURING DEVICE EMBEDDED SUBSTRATE, AND DEVICE EMBEDDED SUBSTRATE

(71) Applicant: MEIKO ELECTRONICS CO., LTD., Ayase-shi, Kanagawa (JP)

(72) Inventors: Mitsuaki Toda, Ayase (JP); Tohru Matsumoto, Ayase (JP); Seiko Murata, Ayase (JP)

(73) Assignee: MEIKO ELECTRONICS CO., LTD., Ayase-shi, Kanagawa (JP)

( * ) Notice: Subject to any disclaimer, the term of this patent is extended or adjusted under 35 U.S.C. 154(b) by 0 days.

(21) Appl. No.: 14/890,896

(22) PCT Filed: May 14, 2013

(86) PCT No.: PCT/JP2013/063432
§ 371 (c)(1),
(2) Date: Nov. 12, 2015

(87) PCT Pub. No.: WO2014/184873
PCT Pub. Date: Nov. 20, 2014

(65) Prior Publication Data
US 2016/0099215 A1 Apr. 7, 2016

(51) Int. Cl.
*H01L 23/538* (2006.01)
*H01L 21/768* (2006.01)
(Continued)

(52) U.S. Cl.
CPC .......... *H01L 23/5389* (2013.01); *H01L 21/56* (2013.01); *H01L 21/76879* (2013.01); *H01L 23/293* (2013.01); *H01L 23/5384* (2013.01); *H01L 23/5386* (2013.01); *H01L 24/25* (2013.01); *H01L 24/82* (2013.01);
(Continued)

(58) Field of Classification Search
USPC ........................................................ 257/774
See application file for complete search history.

(56) References Cited

U.S. PATENT DOCUMENTS 7,902,661 B2 * 3/2011 Smeys ............... H01L 21/4853
257/415
2007/0141759 A1 * 6/2007 Nagase ............... H01L 23/5389
438/126
(Continued)

FOREIGN PATENT DOCUMENTS

| EP | 1 770 776 A2 | 4/2007 |
|---|---|---|
| JP | 2001-053447 A | 2/2001 |
| JP | 2007-173276 A | 7/2007 |
| JP | 2007-535157 A | 11/2007 |
| JP | 2011-522403 A | 7/2011 |
| JP | 2011-222554 A | 11/2011 |

(Continued)

OTHER PUBLICATIONS

Search Report for PCT/JP2013/063432, mailed Aug. 6, 2013.
Supplementary European Search Report for European Patent Application No. 13884904, dated Jan. 3, 2017.

*Primary Examiner* — Selim Ahmed
*Assistant Examiner* — Lawrence Tynes, Jr.
(74) *Attorney, Agent, or Firm* — Marshall, Gerstein & Borun LLP

(57) ABSTRACT

In a method for manufacturing a device embedded substrate, a conductive via that penetrates a first insulating layer and a second insulating layer from an outer metal layer to reach a second terminal of an IC device is formed after forming the outer metal layer.

12 Claims, 6 Drawing Sheets

(51) Int. Cl.
    *H01L 21/56*    (2006.01)
    *H01L 23/29*    (2006.01)
    *H05K 1/18*    (2006.01)
    *H01L 23/00*    (2006.01)
    *H05K 3/46*    (2006.01)

(52) U.S. Cl.
    CPC .... *H05K 1/188* (2013.01); *H01L 2224/04105* (2013.01); *H01L 2224/2518* (2013.01); *H01L 2224/32245* (2013.01); *H01L 2224/73217* (2013.01); *H01L 2224/73267* (2013.01); *H01L 2224/8203* (2013.01); *H01L 2224/92144* (2013.01); *H01L 2224/92244* (2013.01); *H01L 2924/13091* (2013.01); *H05K 3/4602* (2013.01); *H05K 3/4652* (2013.01); *H05K 2201/10166* (2013.01)

(56) References Cited

U.S. PATENT DOCUMENTS

| | | | |
|---|---|---|---|
| 2007/0227761 A1* | 10/2007 | Tuominen | H01L 23/5389 174/252 |
| 2010/0214750 A1* | 8/2010 | Tuominen | H01L 23/5389 361/761 |
| 2011/0069448 A1 | 3/2011 | Weichslberger et al. | |
| 2011/0127675 A1 | 6/2011 | Ewe et al. | |

FOREIGN PATENT DOCUMENTS

| | | |
|---|---|---|
| JP | 4874305 B2 | 2/2012 |
| KR | 2007-0007583 A | 1/2007 |
| WO | WO-2005/104636 A1 | 11/2005 |

* cited by examiner

METHOD FOR MANUFACTURING DEVICE EMBEDDED SUBSTRATE, AND DEVICE EMBEDDED SUBSTRATE

TECHNICAL FIELD

The present invention relates to a manufacturing method for manufacturing a device embedded substrate in which an electrical device or an electronic device is embedded, and a device embedded substrate manufactured by the manufacturing method.

BACKGROUND ART

Conventionally, research and development has been performed for reducing a size, a thickness, and a weight, and increasing functions of various electrical and electronic equipment. Particularly, in consumer products such as mobile phones, notebook computers, and digital cameras, there is a strong demand for the reduction in size, thickness, and a weight while increasing functions. Also, in various electrical and electronic equipment, a frequency and a speed of a transmission signal have been increased, and it is also required to prevent a corresponding increase in signal noise.

In order to meet such demands, a device embedded substrate having a structure in which various electrical and electronic devices, which have been conventionally mounted on a substrate surface, are embedded in an insulating base material that is an insulating layer of a substrate, and a device embedded multilayer circuit board obtained by laminating the device embedded substrates have been conventionally researched, developed, and manufactured as a circuit board incorporated in electrical and electronic equipment. For example, Patent Document 1 discloses a device embedded substrate and a manufacturing method thereof.

In the method for manufacturing a device embedded substrate disclosed in Patent Document 1, a conductive thin film layer made of a copper foil is formed on a support body, and an adhesive is applied onto the conductive thin film layer. Subsequently, an embedded device is mounted via the adhesive, and an insulating base material is then formed so as to cover the embedded device. In the device embedded substrate formed through manufacturing steps as described above, a thickness of the substrate itself is smaller than that of a conventional device embedded substrate, and more electrical and electronic devices can be embedded than those mounted on a substrate surface. Thus, the device embedded substrate can be used for electrical and electronic equipment for various purposes.

PRIOR ART DOCUMENT

Patent Document

Patent Document 1: Japanese Patent No. 4874305

SUMMARY OF THE INVENTION

Problems to be Solved by the Invention

In a case in which a general metal-oxide-semiconductor field-effect transistor (MOSFET) is used as the embedded device, a drain via that electrically connects a drain terminal of the MOSFET and an interconnection layer of the device embedded substrate is formed in order to improve electrical properties. In order to form a multilayer interconnection of the device embedded substrate, the interconnection layer (that is, an inner-layer interconnection) connected to the drain via is covered with an insulating layer, and another interconnection layer (that is, an outer-layer interconnection) is formed on a surface of the insulating layer.

However, in the general MOSFET, the drain terminal side has a weak structure, so that a crack is generated in the MOSFET due to a pressure concentration in the drain via when the outer-layer interconnection is press-formed.

The present invention has been made in view of the problem as described above, and an object thereof is to provide a method for manufacturing a device embedded substrate, which suppresses generation of a crack in an embedded device during a step of manufacturing a device embedded substrate, and a device embedded substrate with a lower crack generation rate in an embedded device than that of a conventional device embedded substrate.

Means for Solving the Problems

In order to achieve the above object, a method for manufacturing a device embedded substrate of the present invention is a method for manufacturing a device embedded substrate in which an IC device including a first terminal on a first surface side and a second terminal on a second surface side having a weaker structure than that of the first surface side is embedded, the method including: a preparation step of preparing a support plate where a metal film is formed on a surface; a mounting step of mounting the IC device by joining the first terminal onto a surface of the metal film via an adhesive layer, and arranging the second terminal on an opposite side to the adhesive layer side; a first insulating layer formation step of forming a first insulating layer in which the IC device is embedded by laminating an insulating resin material so as to cover the metal film and the IC device; an inner metal layer formation step of forming an inner metal layer on a surface of the first insulating layer; a first terminal interconnection pattern formation step of forming a first terminal interconnection pattern by electrically connecting the first terminal and the metal film; a second insulating layer formation step of forming a second insulating layer by laminating an insulating resin material so as to cover the inner metal layer; an outer metal layer formation step of forming an outer metal layer on a surface of the second insulating layer; and a conductive via formation step of forming a conductive via that electrically connects the outer metal layer and the second terminal by forming a via that penetrates the first insulating layer and the second insulating layer from the outer metal layer to reach the second terminal and filling a conductor into the via.

In the above method for manufacturing a device embedded substrate, the first terminal may be at least one of a source terminal and a gate terminal, and the second terminal may be a drain terminal.

In any of the above method for manufacturing a device embedded substrate, the inner metal layer formation step may include a pattern formation step of forming a desired shape in the inner metal layer, and in the conductive via formation step, the outer metal layer and the second terminal may be directly connected by penetrating the second insulating layer in a non-formation portion of the inner metal layer.

Also, without forming the via that directly connects the outer metal layer and the second terminal, in the conductive via formation step, the second terminal, the inner metal layer, and the outer metal layer may be electrically connected by the conductive via by bringing the conductive via into contact with the inner metal layer.

In the conductive via formation step in the above method for manufacturing a device embedded substrate, the conductive via is preferably formed by filling a filled plating or a conductive paste.

In the above method for manufacturing a device embedded substrate, generation of a crack in the IC device is prevented by performing the conductive via formation step after the outer metal layer formation step.

Furthermore, in order to achieve the above object, a device embedded substrate of the present invention includes: a first insulating layer that contains an insulating resin material; an IC device that includes a first terminal on a first surface side and a second terminal on a second surface side having a weaker structure than that of the first surface side, and that is embedded in the insulating layer; a first terminal interconnection pattern that electrically connects the first terminal of the IC device and an outer portion of the first insulating layer; an inner metal layer that is formed on an opposite side to a surface of the first insulating layer where the first terminal interconnection pattern is formed; a second insulating layer that contains an insulating resin material and that is formed so as to cover the inner metal layer; an outer metal layer that is formed on the second insulating layer; and a conductive via that penetrates the first insulating layer and the second insulating layer to electrically connect the outer metal layer and the second terminal, wherein a portion penetrating the first insulating layer and a portion penetrating the second insulating layer of the conductive via are formed in one step.

In the above device embedded substrate, the first terminal may be at least one of a source terminal and a gate terminal, and the second terminal may be a drain terminal.

In any of the above device embedded substrate, the conductive via may directly connect the outer metal layer and the second terminal without electrically connecting the outer metal layer and the inner metal layer.

Also, without directly connecting the outer metal layer and the second terminal, the conductive via may electrically connect the outer metal layer, the inner metal layer, and the second terminal while penetrating the inner metal layer.

In any of the above device embedded substrate, the conductive via is preferably formed by filling a filled plating or a conductive paste.

In any of the above device embedded substrate, generation of a crack in the IC device is prevented by forming the conductive via after forming the outer metal layer.

Advantageous Effects of the Invention

In the method for manufacturing a device embedded substrate according to the present invention, the conductive via that penetrates the first insulating layer and the second insulating layer from the outer metal layer to reach the second terminal is formed after forming the outer metal layer. Thus, a pressure concentration does not occur in the IC device and the second terminal when the outer metal layer is formed. Therefore, no crack is generated in the IC device embedded in the first insulating layer during the steps of manufacturing a device embedded substrate.

In the device embedded substrate according to the present invention, the conductive via that penetrates the first insulating layer and the second insulating layer from the outer metal layer to reach the second terminal is formed in one step after forming the outer metal layer. Thus, no crack is generated due to the pressure concentration in the IC device and the second terminal, so that the device embedded substrate has excellent electrical properties and reliability.

Also, in the device embedded substrate according to the present invention, when the outer metal layer, the inner metal layer, and the second terminal of the IC device are electrically connected by the conductive via, the electrical properties are improved.

MODE FOR CARRYING OUT THE INVENTION

Figure 1:
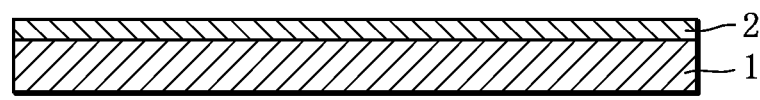
FIG. 1 is a schematic sectional view in each manufacturing step of a method for manufacturing a device embedded substrate according to an embodiment of the present invention.

In the following, a form of embodiment of the present invention is described in detail based on an embodiment and a modification by reference to the drawings. Note that the present invention is not limited to contents described below, and can be optionally modified and carried out without departing from the scope. Also, in the drawings used for describing the embodiment and the modification, all of which schematically show a device embedded substrate and its constituent members according to the present invention, the device embedded substrate and the constituent members are partially emphasized, enlarged, reduced, or omitted for the purpose of developing an understanding. Thus, the drawings do not accurately show scales, shapes or the like of the device embedded substrate and the constituent members in some cases. Furthermore, various numerical values used in the embodiment and the modification are merely examples, and can be various changed if necessary.

Embodiment

In the following, a method for manufacturing a device embedded substrate according to the embodiment of the present invention is described in detail by reference to FIGS. 1 to 9. Here, FIGS. 1 to 9 are schematic sectional views in respective manufacturing steps of the method for manufacturing a device embedded substrate according to the present embodiment.

First, as shown in FIG. 1, a preparation step of preparing a support plate 1 is performed. To be more specific, by forming a metal film 2 on the support plate 1 having stiffness, the support plate 1, a surface of which is covered with the metal film 2, is prepared. The metal film 2 is to become a portion of a first terminal interconnection pattern in a subsequent manufacturing step. As the support plate 1, a plate having stiffness required in process conditions is used. For example, the support plate 1 may be formed of an SUS (stainless steel) plate or an aluminum plate having stiffness. Also, in the present embodiment, the metal film 2 is made of copper. For example, when the support plate 1 is the SUS plate, the metal film 2 can be formed by depositing a copper plating, and when the support plate 1 is the aluminum plate, the metal film 2 can be formed by attaching a copper foil.

Figure 2:
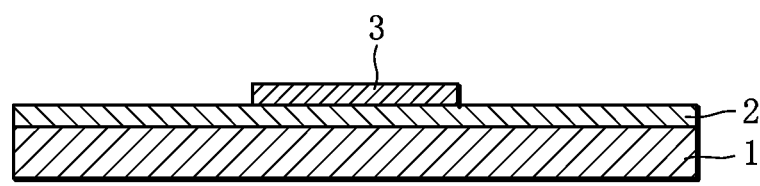
FIG. 2 is a schematic sectional view in each manufacturing step of the method for manufacturing a device embedded substrate according to the embodiment of the present invention.

Subsequently, as shown in FIG. 2, an adhesive layer 3 made of an insulating material is formed on the metal film 2, for example, by a dispenser or by printing. In the present embodiment, an IC device 4 described below is fixed onto the metal film 2 by mounting the IC device 4 on the adhesive layer 3. Although the adhesive layer 3 is formed at one position on the metal film 2 in order to embed one IC device in the present embodiment, the number and an arrangement configuration of the adhesive layers 3 can be appropriately changed according to the number, dimensions, and shapes of embedded devices to be mounted. Also, a material of the adhesive layer 3 is not limited to the insulating material, and a solder paste may be used. In this case, steps performed for electrically connecting a terminal of the IC device 4 and the metal film 2 (forming a via hole and forming a conductive via) described below become unnecessary.

Figure 3:
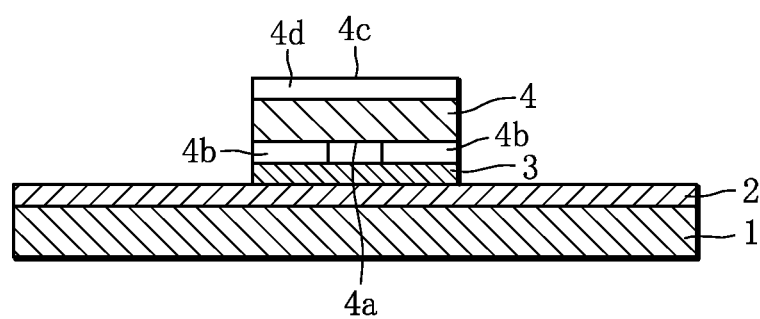
FIG. 3 is a schematic sectional view in each manufacturing step of the method for manufacturing a device embedded substrate according to the embodiment of the present invention.

Subsequently, as shown in FIG. 3, a mounting step of mounting the IC device 4 on the metal film 2 via the adhesive layer 3 is performed. Here, the IC device 4 is a general MOSFET, and includes a first terminal 4b that functions as at least one of a gate terminal and a source terminal on a first surface 4a-side, and a second terminal 4d that functions as a drain terminal on a second surface 4c-side located opposite to the first surface 4a. Also, in the IC device 4, a metal layer that is the drain terminal occupies a large portion of the second surface 4c-side where the second terminal 4d is formed, and the second surface 4c-side thus has a relatively weak structure, while the first surface 4a-side where the first terminal 4b is formed has a relatively strong layer structure composed of a metal layer and an insulating layer etc. That is, in the IC device 4, the drain terminal side has a weaker structure than that of the gate terminal side and the source terminal side, and a crack is easily generated therein due to an influence of an external stress or the like. In a case in which the gate terminal and the source terminal are provided on the first surface 4a-side of the IC device, at least two first terminals 4b are provided, one of which functions as the gate terminal, and the other of which functions as the source terminal.

As a specific mounting method, the IC device 4 that is an embedded device is mounted on the adhesive layer by using a surface mounting machine (a chip mounter) including a suction nozzle. Here, the first surface 4a of the IC device 4 is brought close to the adhesive layer 3, and the first terminal 4b of the IC device 4 is joined to a surface of the metal film 2 via the adhesive layer 3. That is, the first terminal 4b is arranged at a position close to the metal film 2, and the second terminal 4d is arranged at a position away from the metal film 2.

Figure 4:
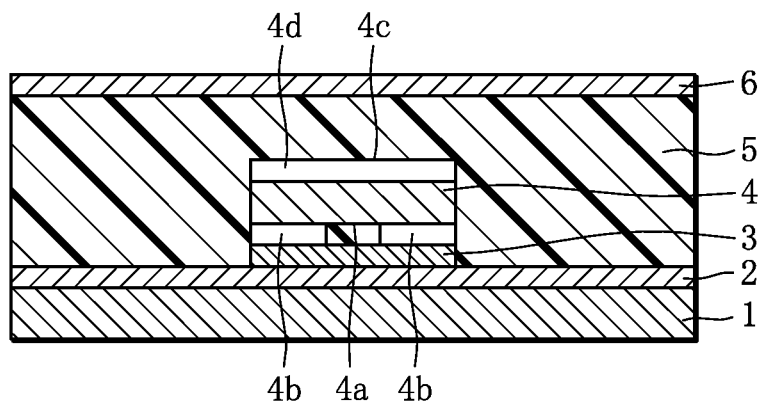
FIG. 4 is a schematic sectional view in each manufacturing step of the method for manufacturing a device embedded substrate according to the embodiment of the present invention.

Subsequently, as shown in FIG. 4, a first insulating layer formation step of forming a first insulating layer 5 is performed. In the first insulating layer formation step, an insulating resin material that is to become the first insulating layer 5 is laminated so as to cover the metal film 2 and the IC device 4 (that is, on the metal film 2 and the IC device 4), and the IC device 4 is thereby embedded in the first insulating layer 5. To be more specific, the first insulating layer formation step is performed by laying up an insulating resin material such as a prepreg on a side of the IC device 4 (that is, the second surface 4c-side) opposite to a side where the metal film 2 is arranged, and pressing the insulating resin material while heating the insulating resin material in a vacuum. The pressing is performed by using, for example, a vacuum pressure-type press machine. Note that it is preferable to use an insulating resin material having a thermal expansion coefficient close to that of the IC device 4. Also, when the first insulating layer 5 is formed, an inner metal layer 6 for the second terminal 4d is formed on a surface on an opposite side to a surface where the metal film 2 is located. Here, the inner metal layer 6 is to become a portion of an interconnection pattern for the second terminal 4d in a subsequent manufacturing step.

Figure 5:
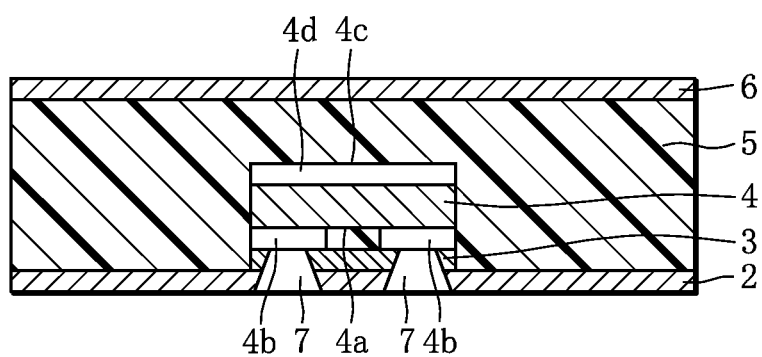
FIG. 5 is a schematic sectional view in each manufacturing step of the method for manufacturing a device embedded substrate according to the embodiment of the present invention.

Subsequently, as shown in FIG. 5, the support plate 1 is removed, and a first via 7 that penetrates the metal film 2 and the adhesive layer 3 to reach the first terminal 4b of the IC device 4 is formed. As a method for forming the first via 7, the support plate 1 is first removed, and a via formation position is then irradiated with, for example, a $CO_2$ laser beam. A member in the portion irradiated with the $CO_2$ laser beam is thereby removed to form the first via 7. Note that the present invention is not limited to the $CO_2$ laser beam, and, for example, a high-frequency laser beam such as a UV-YAG or excimer laser beam may be used.

After the first via 7 is formed, a desmear process is preferably performed to remove a resin remaining in the via formation. A soft etching process is also preferably performed on the first terminal 4b to remove oxides and organic matters on an exposed surface of the first terminal 4b exposed by the via formation. Accordingly, a fresh metal surface is exposed, and adhesion with metal deposited in a subsequent plating process is improved, resulting in an improvement in electrical connection reliability.

Figure 6:
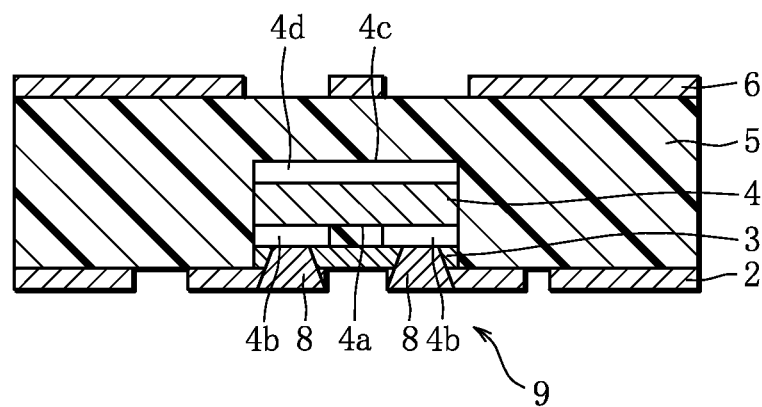
FIG. 6 is a schematic sectional view in each manufacturing step of the method for manufacturing a device embedded substrate according to the embodiment of the present invention.

Subsequently, as shown in FIG. 6, a first conductive via 8 is formed by filling a conductor into the first via 7, and patterning of the metal film 2 and the inner metal layer 6 is performed. Accordingly, a first terminal interconnection pattern 9 composed of the first conductive via 8 and the patterned metal film 2 is formed. To be more specific, the first conductive via 8 is formed by performing a plating process of a chemical copper plating, an electrolytic copper plating, or the like on the first via 7 after performing a desmear or half etching process if necessary, and thereby depositing a plating on the first via 7 to fill the conductor. An etching process is performed on the metal film 2 and the inner metal layer arranged on the both surfaces of the first insulating layer 5. Here, the etching on the inner metal layer 6 is performed such that an opening is formed in a portion immediately above the second terminal 4d of the IC device 4. That is, there is a region in which the inner metal layer 6 does not exist in the portion immediately above the second terminal 4d of the IC device 4, and the first insulating layer 5 is exposed on the region portion. Through the steps as described above, the first terminal interconnection pattern 9 that extends from an inner portion (that is, the first terminal 4b of the IC device 4) to an outer portion of the first insulating layer 5, and also extends on the surface of the first insulating layer 5 is formed.

In the above step of forming the first conductive via 8, a filled via that is the first conductive via 8 is formed by filling the first via 7 with a filled plating that is the conductor. However, the first conductive via 8 may be formed by filling the first via 7 with a conductive paste.

Figure 7:
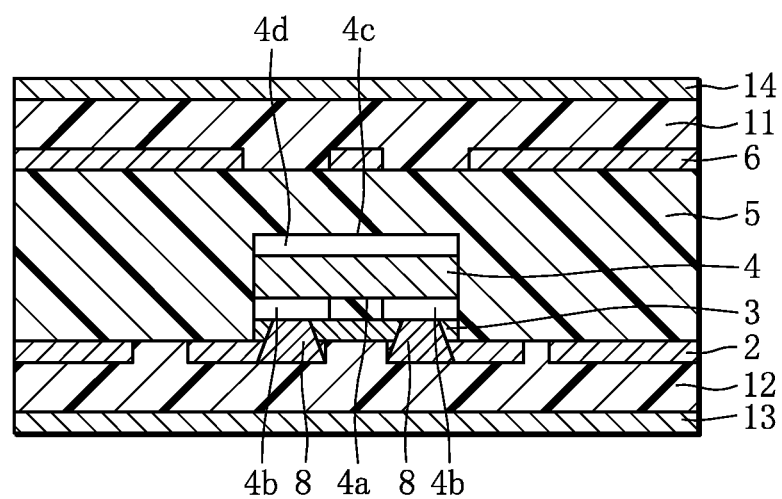
FIG. 7 is a schematic sectional view in each manufacturing step of the method for manufacturing a device embedded substrate according to the embodiment of the present invention.

Subsequently, as shown in FIG. 7, an additional insulating layer formation step of forming a second insulating layer 11 and a third insulating layer 12 is performed. In the additional insulating layer formation step, an insulating resin material that is to become the second insulating layer 11 is laminated so as to cover the patterned inner metal layer 6, and an insulating resin material that is to become the third insulating layer 12 is laminated so as to cover the patterned metal film 2, so that an intermediate form in a state in which the IC device 4 is embedded is sandwiched between the second insulating layer 11 and the third insulating layer 12. In the present embodiment, specific methods for forming the second insulating layer 11 and the third insulating layer 12 and insulating materials are the same as the method for forming the first insulating layer 5 and the insulating material described above, and thus, a description thereof is omitted. However, the methods for forming the second insulating layer 11 and the third insulating layer 12 and the insulating materials may not be the same as the method for forming the first insulating layer 5 and the insulating material described above, and another known formation method and another general insulating material may be used.

Also, as shown in FIG. 7, a first outer metal layer 13 and a second outer metal layer 14 are formed on surfaces of the second insulating layer 11 and the third insulating layer 12 when the second insulating layer 11 and the third insulating layer 12 are formed. That is, an outer metal layer formation step of forming the first outer metal layer 13 and the second outer metal layer 14 that are additional metal layers is performed. Here, the second outer metal layer 14 is to become a portion of the interconnection pattern for the second terminal 4d in the subsequent manufacturing step.

Figure 8:
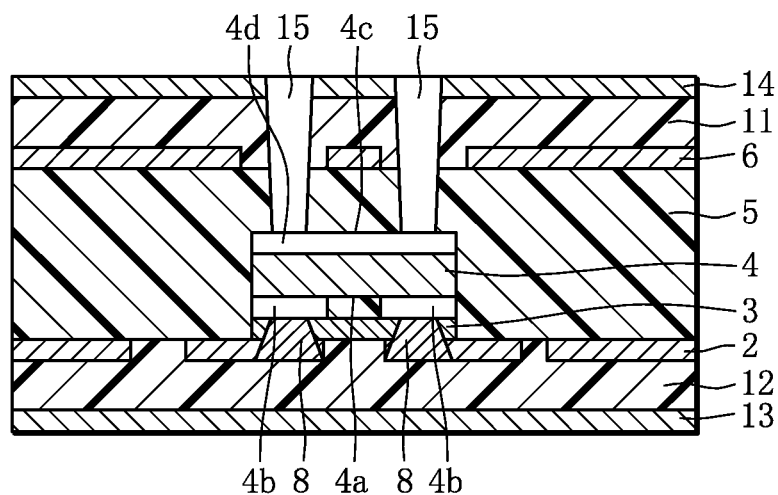
FIG. 8 is a schematic sectional view in each manufacturing step of the method for manufacturing a device embedded substrate according to the embodiment of the present invention.

Subsequently, as shown in FIG. 8, a second via 15 that penetrates the second outer metal layer 14, the second insulating layer 11, and the first insulating layer 5 to reach the second terminal 4d of the IC device 4 is formed. As a method for forming the second via 15, a via formation position is irradiated with, for example, a $CO_2$ laser beam in a similar manner to the method for forming the first via 7. A member in the portion irradiated with the $CO_2$ laser beam is thereby removed to form each via. Note that the present invention is not limited to the $CO_2$ laser beam, and, for example, a high-frequency laser beam such as a UV-YAG or excimer laser beam may be used.

Here, in the step of forming the second via 15, the second via 15 is formed so as to penetrate the second insulating layer 11 and the second outer metal layer 14 located in a portion immediately above the first insulating layer 5 exposed by the patterning of the inner metal layer 6. That is, the second via 15 penetrates the second insulating layer 11 that fills the pattern opening portion of the inner metal layer 6 (in other words, the second insulating layer 11 in a non-formation portion of the inner metal layer 6) without penetrating the inner metal layer 6.

After the second via 15 is formed, a desmear process is preferably performed to remove a resin remaining in the via formation. A soft etching process is also preferably performed on the second terminal 4d to remove oxides and organic matters on an exposed surface of the second terminal 4d exposed by the via formation. Accordingly, a fresh metal surface is exposed, and adhesion with metal deposited in a subsequent plating process is improved, resulting in an improvement in electrical connection reliability.

Figure 9:
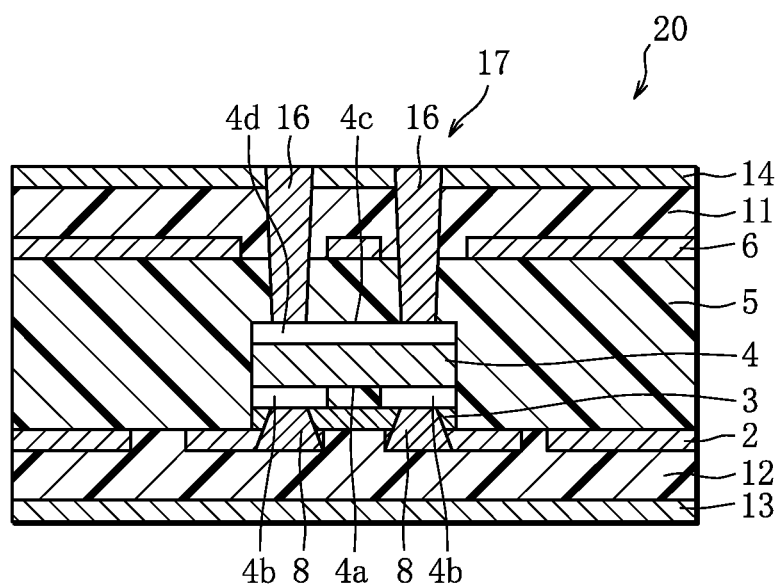
FIG. 9 is a schematic sectional view in each manufacturing step of the method for manufacturing a device embedded substrate according to the embodiment of the present invention.

Subsequently, as shown in FIG. 9, a second conductive via 16 is formed by filling a conductor into the second via 15, and patterning of the second outer metal layer 14 is performed. Accordingly, a second terminal interconnection pattern 17 including the second conductive via 16 and the patterned second outer metal layer 14 is formed. That is, after forming the second via 15 that penetrates the first insulating layer 5 and the second insulating layer 11 from the second outer metal layer 14 to reach the second terminal 4d, a conductive via formation step of forming the second conductive via 16 that electrically connects the second outer metal layer 14 and the second terminal 4d by filling the conductor into the second via 15 is performed. To be more specific, the second conductive via 16 is formed by performing a plating process of a chemical copper plating, an electrolytic copper plating, or the like on the second via 15 after performing a desmear or half etching process if necessary, and thereby depositing a plating on the second via 15 to fill the conductor. An etching process is performed on the second outer metal layer 14 formed on the second insulating layer 11. Through the steps as described above, the second terminal interconnection pattern 17 that extends from an inner portion (that is, the second terminal 4d of the IC device 4) to an outer portion of the first insulating layer 5, and also extends on the surface of the second insulating layer 11 is formed.

When the step of forming the second conductive via 16 as described above is performed, a portion penetrating the first insulating layer 5 and a portion penetrating the second insulating layer 11 out of a portion constituting the second conductive via 16 are formed in the same step after forming the second outer metal layer 14. That is, there is no boundary between the portion penetrating the first insulating layer 5 and the portion penetrating the second insulating layer 11, and the portion penetrating the first insulating layer 5 and the portion penetrating the second insulating layer 11 are continuously formed by the same material.

Here, although not shown in FIG. 9, the inner metal layer 6 and the second outer metal layer are electrically connected by another conductive via or the like. That is, the second terminal interconnection pattern also includes the patterned inner metal layer 6. The other conductive via is similarly formed in the above steps of forming the second via and filling the conductor into the second via. Note that the other conductive via that electrically connects the inner metal layer 6 and the second outer metal layer may not be formed. Also, the first terminal interconnection pattern 9 composed of the metal film 2 and the first conductive via 8 may be electrically connected to the first outer metal layer 13 by another conductive via that penetrates the third insulating layer 12.

Formation of a device embedded substrate 20 as shown in FIG. 9 is completed through the manufacturing steps as described above. When an actual device embedded substrate 20 is manufactured, a plurality of device embedded substrates 20 are manufactured as a single substrate, and the single substrate is cut after completion of formation of the plurality of device embedded substrates 20. The plurality of device embedded substrates 20 are eventually manufactured at the same time.

In the manufacturing method of the present embodiment, a conductive via penetrating the first insulating layer 5 and a conductive via penetrating the second insulating layer 11 are formed at the same time as the second conductive via 16 after forming the second outer metal layer 14 without forming a conductive via that is electrically connected to the second terminal 4d of the IC device 4 after forming the inner metal layer 6 and before forming the second outer metal layer 14. Since the second conductive via 16 is formed after forming the second outer metal layer 14 as described above, a pressure concentration does not occur in a drain via (that is, the second conductive via 16) of the IC device 4 when the second outer metal layer 14 is formed, and no crack is generated in the IC device itself.

Although the first conductive via 8 is formed before forming the first outer metal layer on the first terminal 4b-side, the surface side where the first terminal 4b is formed is relatively strong since the first terminal 4b is at least one of the source terminal and the gate terminal. Therefore, even when a pressure concentration occurs in the first conductive via 8, no crack is generated in the IC device 4 itself.

Also, in the manufacturing method of the present embodiment, since the pressure concentration does not occur in the drain via described above after laminating the inner metal layer 6, a manufacturing step in which a load is generated on the IC device 4 to cause generation of a crack in the IC device 4 does not exist. Similarly, a fine crack or the like that causes a defect (a failure of electrical properties) in a product along with a secular change is also not generated in the device embedded substrate 20 of the present embodiment. Therefore, the device embedded substrate 20 has very excellent reliability.

Furthermore, in the device embedded substrate 20 of the present embodiment, since the second outer metal layer 14 and the second terminal 4d of the IC device 4 are directly electrically connected to each other, electrical properties of the device embedded substrate 20 itself can be improved by connecting the second outer metal layer 14 of the device embedded substrate 20 to a ground potential (ground). That is, a potential difference between an ON state and an OFF state of the IC device 4 can be increased, and the IC device 4 can be turned ON and OFF with high accuracy.

In the device embedded substrate 20 of the present embodiment, the second via 15 is filled with a filled plating or a conductive paste to form the second conductive via 16, so that a resistance value of each conductive via can be reduced, and the electrical properties of the device embedded substrate 20 itself can be improved.

As described above, in accordance with the method for manufacturing the device embedded substrate 20 according to the present embodiment, it is possible to provide the device embedded substrate 20 having a lower crack generation rate in the IC device 4 than that of a conventional device embedded substrate with the crack generation in the IC device 4 being suppressed during the steps of manufacturing the device embedded substrate 20 and various processes after the manufacturing steps.

Modification

The method for manufacturing a device embedded substrate according to the present invention is not limited to that of the above embodiment, and the pattern formation of the inner metal layer, and the formation of the second via and the second conductive via may be performed such that the second conductive via comes into contact with the inner metal layer. A method for manufacturing a device embedded substrate in this case, and a device embedded substrate 20' manufactured by the method are described by reference to FIGS. 10 to 13. Here, FIGS. 10 to 13 are schematic sectional views in respective manufacturing steps of the method for manufacturing a device embedded substrate according to the modification. Since the manufacturing steps in FIGS. 1 to 5 (the preparation step to the step of forming the first via 7) in the above embodiment are the same in the manufacturing method of the modification, a description thereof is omitted. Also, the same components as those of the device embedded substrate 20 according to the above embodiment are assigned the same reference numerals, and a description thereof is omitted.

Figure 10:
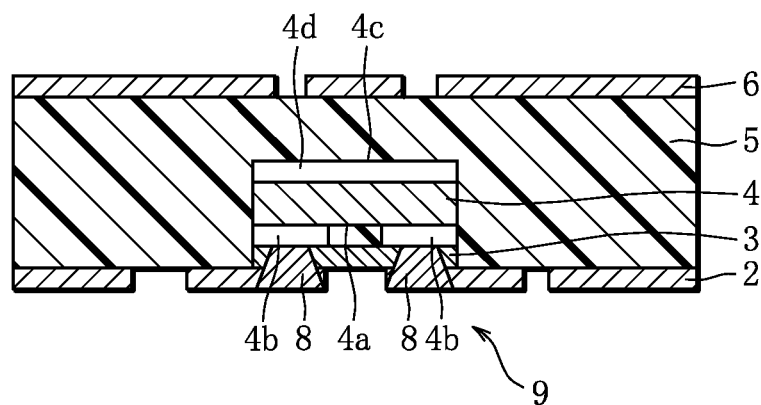
FIG. 10 is a schematic sectional view in each manufacturing step of a method for manufacturing a device embedded substrate according to a modification of the present invention.

As shown in FIG. 10, after forming the first via 7, a first conductive via 8 is formed by filling a conductor into the first via 7, and patterning of the metal film 2 and the inner metal layer 6 is performed. Accordingly, a first terminal interconnection pattern 9 composed of the first conductive via 8 and the patterned metal film 2 is formed. In the present modification, a diameter of the pattern opening formed in the inner metal layer 6 is smaller than that of the above embodiment.

Figure 11:
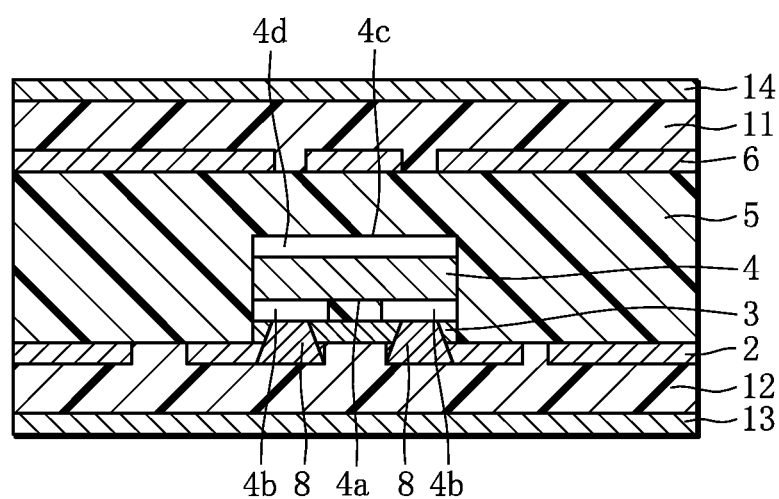
FIG. 11 is a schematic sectional view in each manufacturing step of the method for manufacturing a device embedded substrate according to the modification of the present invention.

Subsequently, as shown in FIG. 11, an additional insulating layer formation step of forming a second insulating layer 11 and a third insulating layer 12 is performed. In the additional insulating layer formation step, an insulating resin material that is to become the second insulating layer 11 is laminated so as to cover the patterned inner metal layer 6, and an insulating resin material that is to become the third insulating layer 12 is laminated so as to cover the patterned metal film 2, so that an intermediate form in a state in which the IC device 4 is embedded is sandwiched between the second insulating layer 11 and the third insulating layer 12.

Also, as shown in FIG. 11, a first outer metal layer 13 and a second outer metal layer 14 are formed on surfaces of the second insulating layer 11 and the third insulating layer 12 when the second insulating layer 11 and the third insulating layer 12 are formed. That is, an outer metal layer formation step of forming the first outer metal layer 13 and the second outer metal layer 14 that are additional metal layers is performed.

Figure 12:
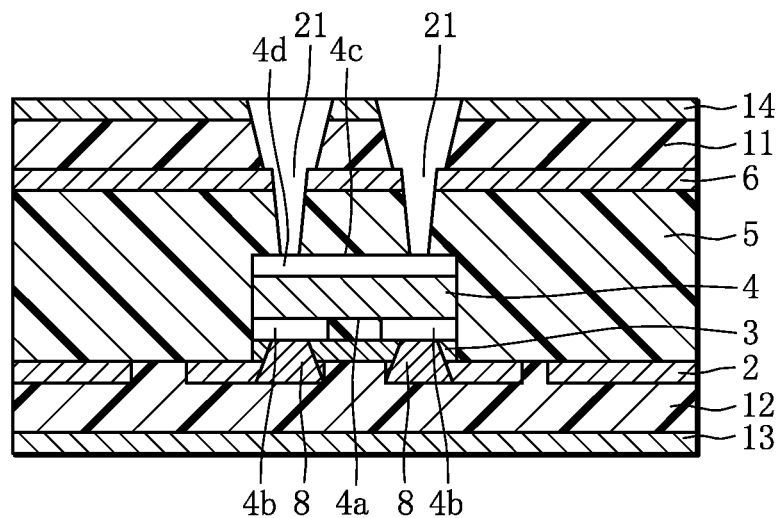
FIG. 12 is a schematic sectional view in each manufacturing step of the method for manufacturing a device embedded substrate according to the modification of the present invention.

Subsequently, as shown in FIG. 12, a second via that penetrates the second outer metal layer 14, the second insulating layer 11, the inner metal layer 6, and the first insulating layer 5 to reach the second terminal 4d of the IC device 4 is formed. As a method for forming the second via 21, a via formation position is irradiated with, for example, a $CO_2$ laser beam in a similar manner to the method for forming the first via 7 of the above embodiment. A member in the portion irradiated with the $CO_2$ laser beam is thereby removed to form each via. At this time, a side portion of the second via 21 is brought into contact with a side surface of the inner metal layer 6. Accordingly, a second conductive via 22 described below is brought into contact with the inner metal layer 6. Note that the present invention is not limited to the $CO_2$ laser beam, and, for example, a high-frequency laser beam such as a UV-YAG or excimer laser beam may be used.

Figure 13:
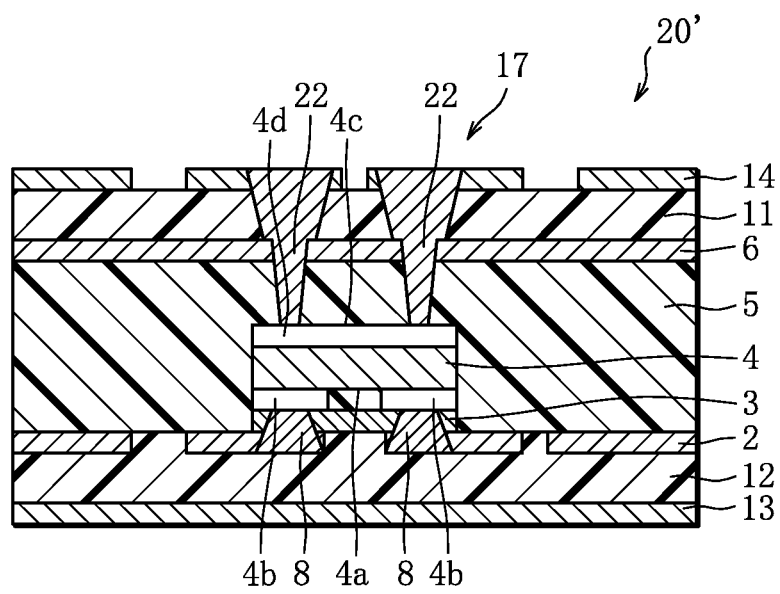
FIG. 13 is a schematic sectional view in each manufacturing step of the method for manufacturing a device embedded substrate according to the modification of the present invention.

Subsequently, as shown in FIG. 13, the second conductive via 22 is formed by filling a conductor into the second via 21, and patterning of the second outer metal layer 14 is performed. Accordingly, a second terminal interconnection pattern 17 composed of the second conductive via 22, the patterned second outer metal layer 14, and the inner metal layer 6 is formed. That is, after forming the second via 21 that penetrates the first insulating layer 5, the inner metal layer 6, and the second insulating layer 11 from the second outer metal layer 14 to reach the second terminal 4d, a conductive via formation step of forming the second conductive via 22 that electrically connects the second outer metal layer 14, the inner metal layer 6, and the second terminal 4d by filling the conductor into the second via 21 is performed. A step of filling the conductor is the same as that of the above embodiment, and thus, a description thereof is omitted. Through the steps as described above, the second terminal interconnection pattern 17 that extends from an inner portion (i.e., the second terminal 4d of the IC device 4) to an outer portion of the first insulating layer 5, and also extends on the surfaces of the first insulating layer 5 and the second insulating layer 11 is formed.

Formation of the device embedded substrate 20' as shown in FIG. 13 is completed through the manufacturing steps as described above. In the device embedded substrate 20', a formation area of the inner metal layer 6 is relatively large, and a formation area of the second terminal interconnection pattern 17 is also larger than that of a conventional device embedded substrate, so that a potential of the second terminal 4d that is the drain terminal can be more surely made closer to a ground potential, and electrical properties of the device embedded substrate 20' are further improved.

EXPLANATION OF REFERENCE SIGNS

1 Support plate
2 Metal film
3 Adhesive layer
4 IC device
4a First surface
4b First terminal
4c Second surface
4d Second terminal
5 First insulating layer
6 Inner metal layer
7 First via
8 First conductive via
9 First terminal interconnection pattern
11 Second insulating layer
12 Third insulating layer
13 First outer metal layer
14 Second outer metal layer
15 Second via
16 Second conductive via
17 Second terminal interconnection pattern
20, 20' Device embedded substrate
21 Second via
22 Second conductive via

The invention claimed is:

1. A method for manufacturing a device embedded substrate in which an IC device including a first terminal on a first surface side and a second terminal on a second surface side, the second surface side being less resistant to crack generation than the first surface side, the method comprising:
a preparation step of preparing a support plate where a metal film is formed on a surface; a mounting step of mounting the IC device by joining the first terminal onto a surface of the metal film via an adhesive layer, and arranging the second terminal on an opposite side to the adhesive layer side; a first insulating layer formation step of forming a first insulating layer in which the IC device is embedded by laminating an insulating resin material so as to cover the metal film and the IC device; an inner metal layer formation step of forming an inner metal layer on a surface of the first insulating layer; an interconnection pattern formation step of forming a first terminal interconnection pattern by electrically connecting the first terminal and the metal film; a second insulating layer formation step of forming a second insulating layer by laminating an insulating resin material so as to cover the inner metal layer; an outer metal layer formation step of forming an outer metal layer on a surface of the second insulating layer; and a conductive via formation step of forming a conductive via that electrically connects the outer metal layer and the second terminal by forming a via that penetrates the first insulating layer and the second insulating layer from the outer metal layer to reach the second terminal and filling a conductor into the via.

2. The method for manufacturing a device embedded substrate according to claim 1, wherein the first terminal is at least one of a source terminal and a gate terminal, and the second terminal is a drain terminal.

3. The method for manufacturing a device embedded substrate according to claim 1, wherein the inner metal layer formation step includes a pattern formation step of forming a desired shape in the inner metal layer, and
in the conductive via formation step, the outer metal layer and the second terminal are directly connected by penetrating the second insulating layer in a non-formation portion of the inner metal layer.

4. The method for manufacturing a device embedded substrate according to claim 1, wherein in the conductive via formation step, the second terminal, the inner metal layer, and the outer metal layer are electrically connected by the conductive via by bringing the conductive via into contact with the inner metal layer.

5. The method for manufacturing a device embedded substrate according to claim 1, wherein in the conductive via formation step, the conductive via is formed by filling a filled plating or a conductive paste.

6. The method for manufacturing a device embedded substrate according to claim 1, wherein generation of a crack in the IC device is prevented by performing the conductive via formation step after the outer metal layer formation step.

7. A device embedded substrate comprising: a first insulating layer that contains an insulating resin material; an IC device that includes a first terminal on a first surface side and a second terminal on a second surface side, the second surface side being less resistant to crack generation than the first surface side, and that is embedded in the insulating layer; a first terminal interconnection pattern that electrically connects the first terminal of the IC device and an outer portion of the first insulating layer; an inner metal layer that is formed on an opposite side to a surface of the first insulating layer where the first terminal interconnection pattern is formed; a second insulating layer that contains an insulating resin material and that is formed so as to cover the inner metal layer; an outer metal layer that is formed on the second insulating layer; and a conductive via that penetrates the first insulating layer and the second insulating layer to electrically connect the outer metal layer and the second terminal, wherein a portion penetrating the first insulating layer and a portion penetrating the second insulating layer of the conductive via are formed in one step.

8. The device embedded substrate according to claim 7, wherein the first terminal is at least one of a source terminal and a gate terminal, and the second terminal is a drain terminal.

9. The device embedded substrate according to claim 7, wherein the conductive via directly connects the outer metal layer and the second terminal without electrically connecting the outer metal layer and the inner metal layer.

10. The device embedded substrate according to claim 7, wherein the conductive via electrically connects the outer metal layer, the inner metal layer, and the second terminal while penetrating the inner metal layer.

11. The device embedded substrate according to claim 7, wherein the conductive via is formed by filling a filled plating or a conductive paste.

12. The device embedded substrate according to claim 7, wherein a crack is not generated in the IC device by forming the conductive via after forming the outer metal layer.

* * * * *